(12) United States Patent
Soo

(10) Patent No.: US 11,702,206 B2
(45) Date of Patent: Jul. 18, 2023

(54) DISPLAY APPARATUS

(71) Applicant: Anthony Soo, Zurich (CH)

(72) Inventor: Anthony Soo, Zurich (CH)

( * ) Notice: Subject to any disclaimer, the term of this patent is extended or adjusted under 35 U.S.C. 154(b) by 0 days.

(21) Appl. No.: 17/800,936

(22) PCT Filed: Feb. 19, 2021

(86) PCT No.: PCT/GB2021/050422
§ 371 (c)(1),
(2) Date: Aug. 19, 2022

(87) PCT Pub. No.: WO2021/165699
PCT Pub. Date: Aug. 26, 2021

(65) Prior Publication Data
US 2023/0081481 A1     Mar. 16, 2023

(30) Foreign Application Priority Data

Feb. 20, 2020 (GB) ..................................... 2002372

(51) Int. Cl.
*B64D 11/00* (2006.01)
*H05K 5/02* (2006.01)
(Continued)

(52) U.S. Cl.
CPC ...... *B64D 11/00151* (2014.12); *B64D 11/003* (2013.01); *B64D 11/0624* (2014.12);
(Continued)

(58) Field of Classification Search
CPC .......... B64D 11/00151; B64D 11/0624; G09G 2360/04; G09G 2370/08; G09G 2370/10; G09G 2380/10
See application file for complete search history.

(56) References Cited

U.S. PATENT DOCUMENTS

2004/0145684 A1   7/2004   Albert
2005/0268319 A1   12/2005   Brady, Jr.
(Continued)

FOREIGN PATENT DOCUMENTS

EP    3437995    2/2019
FR    2817812    6/2002
JP    2005189431 A    7/2005

OTHER PUBLICATIONS

International Search Report and Written Opinion for PCT/GB2021/050422 dated Mar. 5, 2020.
(Continued)

*Primary Examiner* — Gerald Johnson
(74) *Attorney, Agent, or Firm* — Barnes & Thornburg LLP

(57) ABSTRACT

An electronic display apparatus comprising a support frame, wherein mounted within the support frame there is an electronic display configured to display content based on image data, and a display driver circuit to receive the image data and to supply an image signal to the electronic display to cause the electronic display to display the content, the image signal based on the image data. Also mounted in the support frame is a connector cable connecting the display driver circuit and the electronic display for transmission of the image signal from the display driver circuit to the electronic display. The support frame is mountable to one or more surfaces so as to mount the electronic display to a first portion of the one or more surfaces and mount the display driver circuit to a second portion of the one or more surfaces that is away from the first portion, and the support frame maintains the electronic display in a spaced relationship from the display driver circuit.

18 Claims, 7 Drawing Sheets

(51) Int. Cl.
*B64D 11/06* (2006.01)
*G09G 3/20* (2006.01)

(52) U.S. Cl.
CPC ............ *G09G 3/20* (2013.01); *H05K 5/0247* (2013.01); *G09G 2310/0275* (2013.01); *G09G 2360/04* (2013.01); *G09G 2370/08* (2013.01); *G09G 2380/10* (2013.01); *G09G 2380/12* (2013.01)

(56) References Cited

U.S. PATENT DOCUMENTS

| | | | |
|---|---|---|---|
| 2013/0015687 A1 | 1/2013 | Kraemer | |
| 2016/0379537 A1* | 12/2016 | Duchenij | G06F 3/16 345/46 |

OTHER PUBLICATIONS

GB Search and Examination Report for GB2002372.7 dated Mar. 30, 2020.
GB Examination Report for GB2002372.7 dated Mar. 19, 2021, 3 pages.
International (PCT) Search Report for PCT/GB2021/050422 dated Aug. 23, 2022, 7 pages.

* cited by examiner

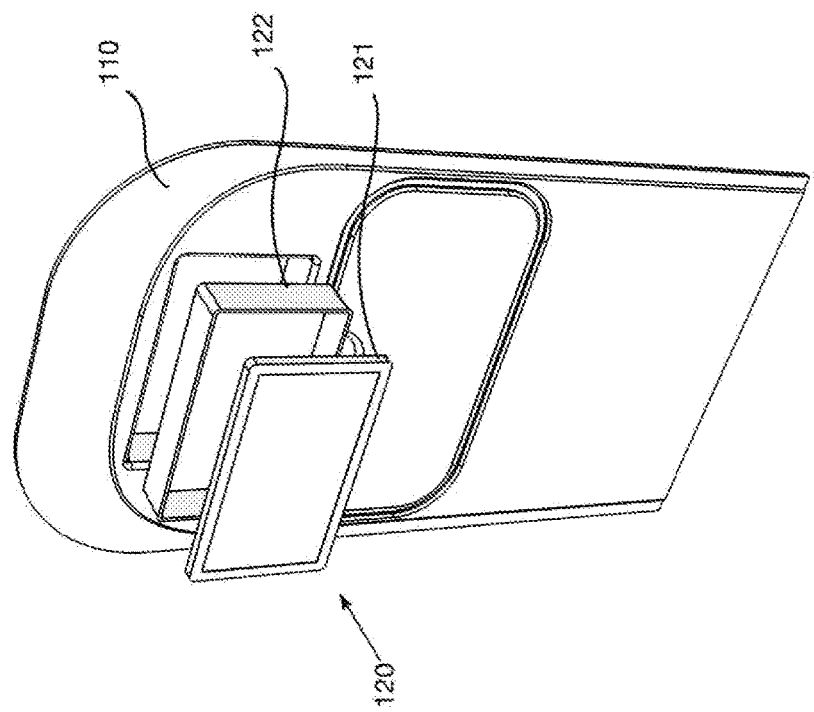
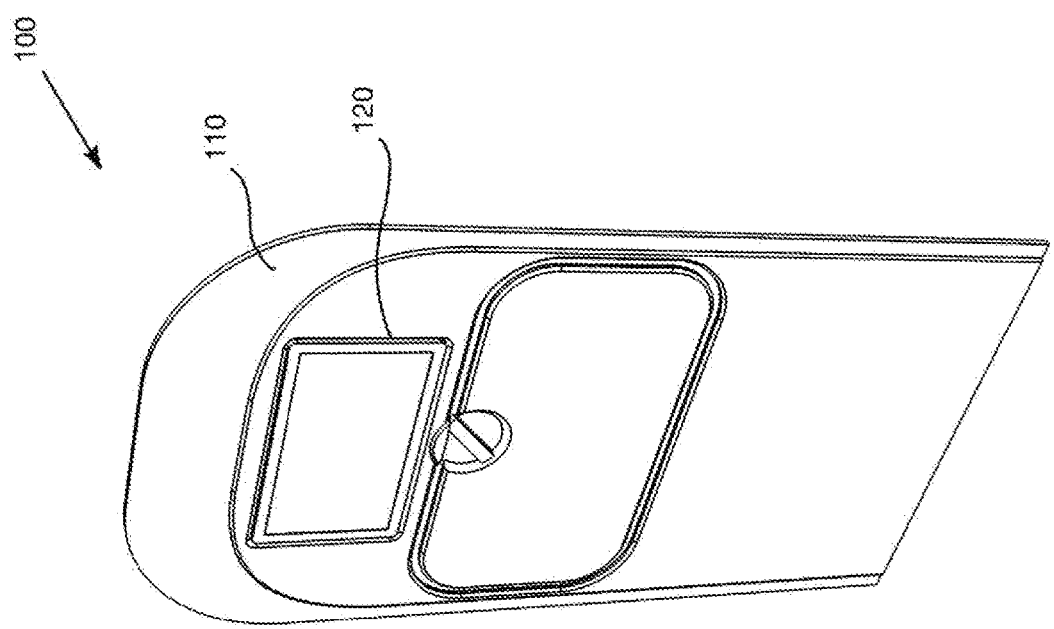
FIG. 2
(PRIOR ART)
FIG. 1
(PRIOR ART)

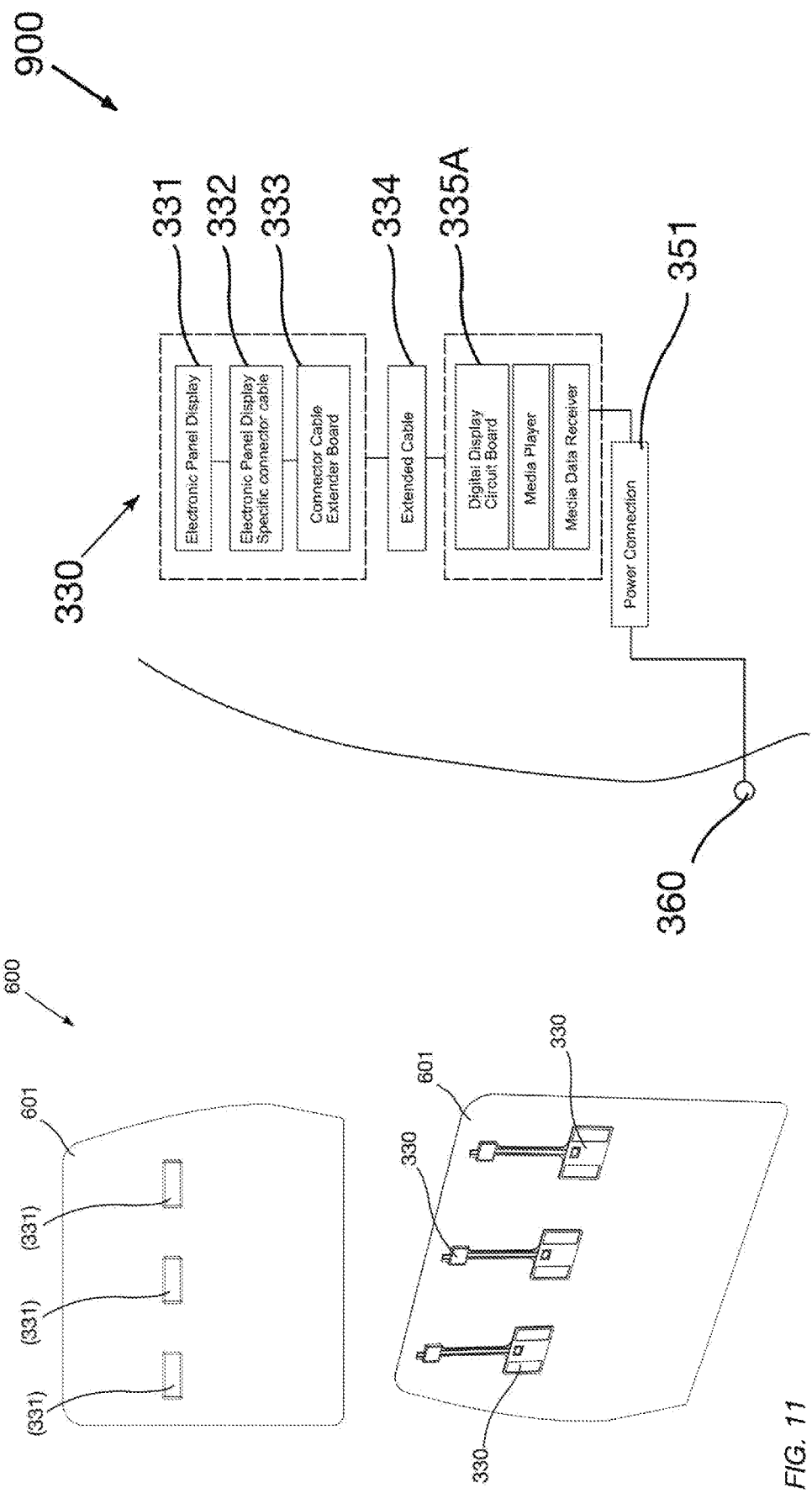

DISPLAY APPARATUS

CROSS REFERENCE TO RELATED APPLICATIONS

This application is a U.S. national stage application under 35 U.S.C. § 371(b) of International Application No. PCT/GB2021/050422, filed Feb. 19, 2021, which claims priority to the United Kingdom Patent Application No. GB2002372.7, filed on Feb. 20, 2022, the disclosures of both of which are hereby expressly incorporated by reference in their entirety.

This invention relates to a display apparatus, and in particular to a display apparatus for use in a space-constrained environment, such as in a seat back of an aircraft.

BACKGROUND

The low-cost carrier industry has seen year-on-year increased pressure to transport more passengers per flight. This demand for more passengers per flight has seen an increase in reduced seat pitches, resulting in tighter legroom and forcing seat manufacturers to improve their design. With seat technology advancing, seats are becoming thinner in profile to accommodate the additional passengers to ultimately deliver a more comfortable experience. In addition to seat technology advancing further in a thinner profile, advances in material also allow the seats to become much lighter therefore benefiting fuel efficiency.

Full-service Airline carriers to improve passenger experience, entertain passengers on long flights, using commercially available in-flight entertainment (IFE) systems installed inside the back rest of the seat. However low-cost carrier Airlines, due to the discounted nature of the flights costs, aim to mediate this problem through cost and weight sensitive solutions.

Current commercially available in-flight entertainment systems do not meet this low cost carrier requirement due to extremely high cost per electronic unit and additional weight increase per seat. This is largely due to the individual seat display unit computers required per passenger seat. The current commercially available in-flight entertainment systems typically feature a plastic or metal enclosure housing all of the electronic circuit boards and LCD display.

It must be noted that the full-service airline carriers obligation to entertain passengers is a high priority index in passenger experience, however in low-cost carrier airlines, due to the inherent low cost of seats, the main focus is on ancillary revenue generation. Low-cost carriers therefore must choose to provide in-flight entertainment advertising in the form of personal electronic device connectivity to wireless access point available media, or resort to legacy in-flight printed media. The choices available are limited and not passenger experience centred.

In-flight marketing has historically been dominated by print media e.g. in-flight magazines, tray table advertisements stickers, bulkhead advertisement stickers, baggage bin advertisements stickers, and back of headrest cover banners. The current industry trend is a shift away from this model, with many carriers having either stopped or planning to stop offering printed media. With digital formats taking the lead, for example in-flight connectivity of passengers' personal electronic devices, it is estimated that global in-flight marketing will grow annually year-on-year.

The Legacy IFE system has a high capital expenditure thus discouraging low cost carrier airline operators from purchasing and installing these systems and thus missing out on significant ancillary revenue generation. Looking at the global fleet of narrowbody (NB) aircraft it can be seen that there is a major gap between NB aircraft with IFE and without (8.1% of global NB fleet with embedded IFE). This gap is directly attributed to the legacy high cost of procuring the system and operational maintenance.

Most passengers on short-haul and mid-haul flights tend to carry their entertainment content onboard with them thus further emboldening the decision of low-cost aircraft operators not to install legacy IFE systems. Having said this, the aircraft operators consistently seek ways to accelerate ancillary revenue while maintaining or improving passenger loyalty (experience).

It is in this context that the present disclosure has been conceived.

BRIEF SUMMARY OF THE DISCLOSURE

In accordance with the present disclosure there is provided an electronic display apparatus comprising a support frame, wherein mounted within the support frame there is: an electronic display configured to display content based on image data; and a display driver circuit to receive the image data and to supply an image signal to the electronic display to cause the electronic display to display the content. The image signal is based on the image data. Also mounted within the support frame is a connector cable connecting the display driver circuit and the electronic display for transmission of the image signal from the display driver circuit to the electronic display. The support frame is mountable to one or more surfaces so as to mount the electronic display to a first portion of the one or more surfaces and mount the display driver circuit to a second portion of the one or more surfaces that is away from the first portion, and the support frame maintains the electronic display in a spaced relationship from the display driver circuit Thus, there is provided electronic display apparatus in which the display driver circuit, sometimes referred to as a display driver circuit board, is not co-located with the electronic display. This enables the electronic display to be mounted in a wider array of locations, such as where size, for example thickness, and/or mass of the electronic display apparatus is constrained in at least the region in which the electronic display is to be viewed. The additional mass and size of the display driver circuit board can be located away from the electronic display and connected thereto via the connector cable so that the mass and/or size of the electronic display apparatus at the electronic display is reduced compared to electronic display apparatus in which the electronic display is co-located with the display driver circuit.

It will be understood that the display driver circuit is the circuitry which converts the image data indicative of the content to be displayed on the electronic display of the electronic display apparatus into image signals to drive pixels of the electronic display to display the content. In some examples, the display driver circuit is for receiving HDMI (High-Definition Multimedia Interface) or DVI (Digital Visual Interface) as source data encoding the image data, and is configured to convert this data to LVDS (Low Voltage Differential Signaling) or OLDI (OpenLDI) as image signals to be displayed on a panel or display. In one example, the display driver circuit functions by receiving three Transition Minimized Differential Signaling pairs TMDS and a clock signal indicative of the content to be displayed on the electronic display, and converting these into image signals (for example output 4 LVDS/OLDI data pairs and clock (1 channel) or 8 LVDS/OLDI data pairs and clock (2 channel)) to drive the pixels of the electronic display to display the content.

The display driver circuit may be configured to supply power to the electronic display. The connector cable may be for transmission of the power from the display driver circuit to the electronic display.

The display driver circuit may still be located on the same surface as the electronic display, but in a different part of the surface. Alternatively, it will be understood that the display driver circuit may be for mounting off the surface, for example on a further surface. The further surface may be adjacent the surface at which the electronic display is to be mounted.

The connector cable may be flexible. Thus, the connector cable can be routed over moving parts, for example where the display driver circuit is to be mounted to be movable relative to the electronic display. Alternatively, the connector cable may be substantially rigid.

The connector cable may comprise a first cable portion connected to the electronic display. The connector cable may comprise a second cable portion connected to the display driver circuit. The connector cable may comprise a cable connector electrically connected between the first cable portion and the second cable portion. The cable connector may be removably connected to the first cable portion. The cable connector may be removably connected to the second cable portion. Thus, where a portion of the connector cable needs to be replaced, for example the second cable portion, only part of the connector cable need be replaced. Alternatively, where the display driver circuit needs to be replaced, this can be achieved by replacement of the display driver circuit and the second cable portion of the connector cable without replacement of the first cable portion. In an example, the cable connector may be frangibly connected to at least one of the first cable portion and the second cable portion. In other words, the cable connector may be arranged to be removable from either the first cable portion or the second cable portion by breaking.

A length of the connector cable may be greater than 10 centimetres. The length of the connector cable may be greater than 30 centimetres. The length of the connector cable may be greater than 50 centimetres. In some examples, a separation distance between the electronic display and the display driver circuit may be greater than 10 centimetres. The separation distance may be greater than 30 centimetres. The separation distance may be greater than 50 centimetres.

The connector cable may be a ribbon cable.

The display driver circuit may be removably connected to the electronic display. Thus, the display driver circuit can be replaced separately to the electronic display.

The electronic display apparatus can be easily installed by mounting the support frame at the one or more surfaces. The electronic display, the display driver circuit and the connector cable may be mounted to the support frame at any time before or after mounting of the support frame at the surface. The support frame may be substantially rigid. In other examples, at least a portion of the support frame may be flexible. In an example, the support frame may be integrally formed.

A thickness of the electronic display apparatus in the region of the electronic display may be less than 20 millimetres. The thickness of the electronic display apparatus in the region of the electronic display may be less than 10 millimetres. The thickness of the electronic display apparatus in the region of the electronic display may be less than 6 millimetres. The thickness of the electronic display apparatus in the region of the electronic display may be less than 5 millimetres. Thus, the electronic display apparatus can be installed even in space constrained locations.

The display driver circuit may be configured to receive the image data from a further electronic device. The further electronic device may be, for example, a media server, such as an electronic media player. Thus, the content to be displayed by the electronic display apparatus may be supplied from outside the electronic display apparatus. The image data may be indicative of the content to be displayed on the electronic display.

The one or more surfaces may be one or more surfaces in a vehicle. The vehicle may be an aircraft. Alternatively, the vehicle may be a land-based vehicle such as a bus, a tram or a car, or the vehicle may be a water-based vehicle, such as a ferry.

The one or more surfaces may include a surface of a seat, such as a seat back. The one or more surfaces may be a back of a head rest of a seat. Thus, the thickness and/or the mass at an upper portion of the seat, such as at the head rest, need not be further increased by the thickness and/or the mass of the display driver circuit, which can be mounted away from the upper portion of the seat, at which the electronic display is to be mounted. Therefore, the seats need only be designed to support the additional mass and/or thickness of the components of the electronic display apparatus to be placed at the upper portion of the seat, and need not be designed to support the additional mass and/or thickness of the display driver circuit.

The one or more surfaces may be an internal wall of a passenger cabin. For example, the internal wall of a passenger cabin may be an internal wall of a passenger cabin in an aircraft, such as a wall of a lavatory, or a galley, or a ceiling.

The one or more surfaces may be one or more surfaces of an overhead storage compartment. The overhead storage compartment may sometimes be referred to as an overhead baggage bin, or an overhead luggage bin. The one or more surfaces of the overhead storage compartment may be on a door of the storage compartment, referred to as a compartment door. The compartment door may sometimes be referred to as a lid of a luggage bin. In some examples, the electronic display may be to be mounted on the compartment door, and the display driver circuit may be to be mounted on another surface, different to the compartment door. Thus, the thickness and/or the mass of the display apparatus at the compartment door need not be further increased by the thickness and/or the mass of the display driver circuit, which can be mounted away from the compartment door, at which the electronic display is to be mounted. It will be understood that the display driver circuit may be to be mounted on another surface of the overhead storage compartment or on another surface, off the overhead storage compartment. Therefore, the compartment door need only be designed to support the additional mass and/or thickness of the components of the electronic display apparatus to be placed at the compartment door, and need not be designed to support the additional mass and/or thickness of the display driver circuit.

Viewed from another aspect, the present disclosure extends to a seat back for a vehicle. The seat back has a headrest portion, having defined a recess on a rear surface thereof. The recess is for receiving the electronic display apparatus as described hereinbefore. The recess has: a first portion to receive the electronic display at a headrest portion of the seat back; a second portion configured to be located below the headrest portion, to receive the display driver circuit; and a third portion connecting the first portion and the second portion to receive the connector cable therein.

Thus, seat backs can be provided which can include an ability to display content using an electronic display mounted thereto, but which need not be designed to support the additional mass and/or thickness of all of the components of the electronic display apparatus at the upper portion of the seat back.

The seat back may further comprise the electronic display apparatus, mounted in the recess.

Viewed from another aspect, the present disclosure extends to a plurality of seats, each seat in the plurality of seats comprising the seat back as described hereinbefore. The plurality of seats may further comprise an electrical media player in data communication with the display driver circuits for each of the seat backs. The plurality of seats may form a row of seats. The row of seats may comprise at least two seats. The row of seats may comprise at least 3 seats.

Viewed from another aspect, the present disclosure extends to a overhead storage compartment for a vehicle. The overhead storage compartment comprises a compartment door. The electronic display apparatus is mounted such that the electronic display of the electronic display apparatus is mounted to the compartment door.

The display driver circuit may be mounted off the compartment door.

BRIEF DESCRIPTION OF THE DRAWINGS

Embodiments of the invention are further described hereinafter with reference to the accompanying drawings, in which:

FIG. 1 is a drawing illustrating a conventional integrated seatback information system, where in all of the system components of the information system are installed inside an enclosed unit in a seat back shroud.

FIG. 2 is a drawing illustrating a conventional integrated seatback information system in an exploded form to show the stacked module of all the system components of the information system pre-installation.

FIG. 11 is an exemplary detail drawing illustrating an alternative embodiment of the integrated system module of FIG. 8, wherein the integrated vertically separated system modules are disposed within a protective substrate and configured for installation on a typical aircraft monument wall assembly (partition, lavatory, galley)

FIG. 14 is an exemplary system diagram illustrating one embodiment of a single assembly for the information systems of FIG. 8 with a digital display circuit board with integrated media player connected to aircraft power.

Figure 4:
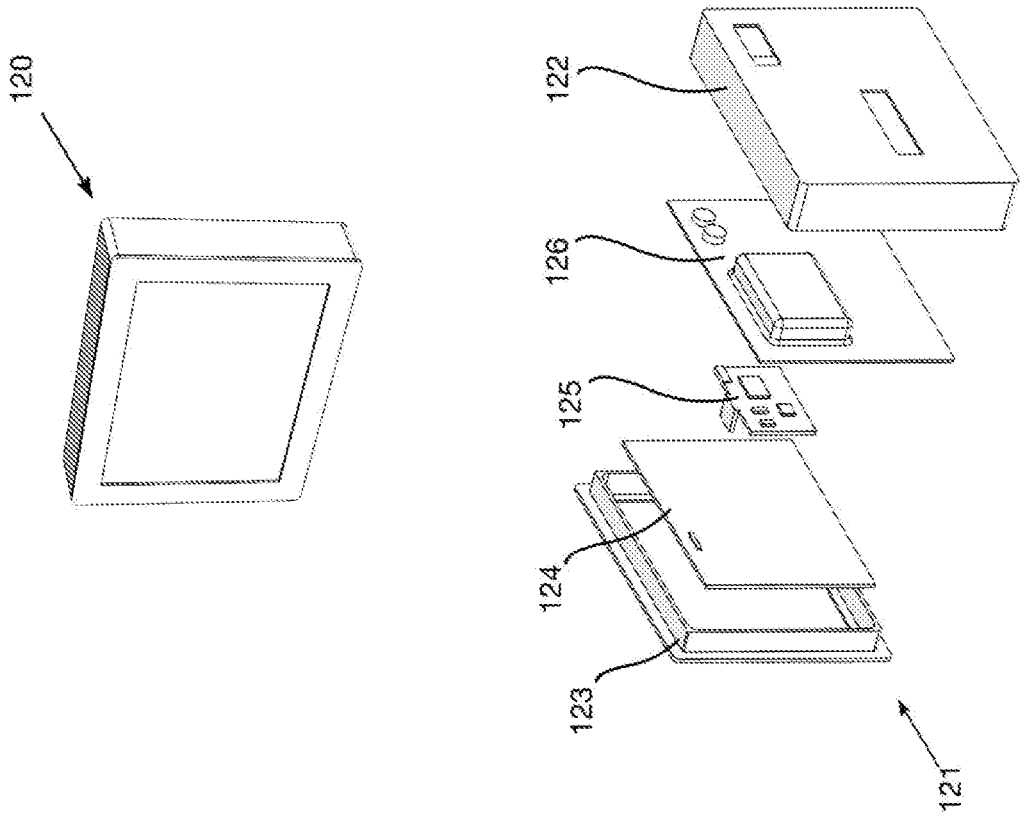
FIG. 4 is a drawing illustrating a conventional integrated seatback information system as an assembled unit and in an exploded form to show the stacked module of all the system components of the information system.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION

Viewed from one aspect, the disclosure presented herein is an ultra-low profile and ultra-light weight seat back digital display system.

Of particular significance is that the digital display screens are separated from their respective display driver circuit boards. In separating these display driver circuit boards, the advantage is that the weight is significantly reduced at the display area application, compared to current commercially available inflight entertainment system screens, in which the display driver circuit board is typically co-located with the display screen at the display area. In weight-sensitive applications, for example, low cost carrier aircraft seats, this is advantageous where the desire is to lower as much additional mass as possible from the head rest area and centre of gravity during retro-fit thus meeting stringent aircraft certification requirements. Thus, by ensuring that, of the electronic display and the display driver circuit board, only the electronic display is integrated into an upper portion of the seat back, typically corresponding to the head rest, a head impact criteria (HIC) is satisfied more easily. The HIC test is a requirement for all inflight entertainment screens integrated into seat backs. This is typically a hard requirement for which to meet compliance during integration.

A number of new advanced seat technology designs utilise very minimal light magnesium structural elements on the backrest, typically prohibiting the installation of metallic internal mounting brackets associated with the current commercially available screen systems and used as stress load paths. In separating the display driver board from the electronic display screen, another advantage is that the thickness at the viewing point is equal to just the thickness of the LCD itself, which may be typically 2.8-3.5 mm. In depth sensitive applications, in particular aircraft seats, this can be advantageous where, for example due to advanced seat design technology, there is not sufficient depth space to allow for installation of a typical commercially available inflight entertainment system screen and associated mounting hardware. This is typically because these commercially available display units comprise of stacked electronic components in a plastic or metal enclosure, which to obtain a flush finish would require significant room, which is typically not available in the limited space of the seat internals.

In some example implementations the presently disclosed display apparatus could be configured to be installed in similar challenging areas that face the same challenges in terms of weight restrictions and/or available installation space. For example but not limited to cabin class divider walls, overhead baggage bins, lavatory walls and galley monument walls.

In view of the above, and the disclosure provided elsewhere in the description, it will be appreciated that the following description is merely exemplary in nature and is not intended to limit the present disclosure. Although the following description is related generally to a system of configuring and installing a digital display to present the passenger information aboard a closed cabin (such as passenger vehicles: aircraft, ship, spacecraft, train or land-based motor-vehicle), it will be understood that the system of configuring and installing a digital display, as described and claimed herein, may be used with any appropriate application where it would be desirable for a digital display to present passenger information in an enclosed cabin. Therefore it will be understood that the following discussion is not intended to limit the scope of the appended claims to only enclosed cabins and enclosed cabin based systems. The scope of the invention is defined with reference to the appended claims.

Figure 3:
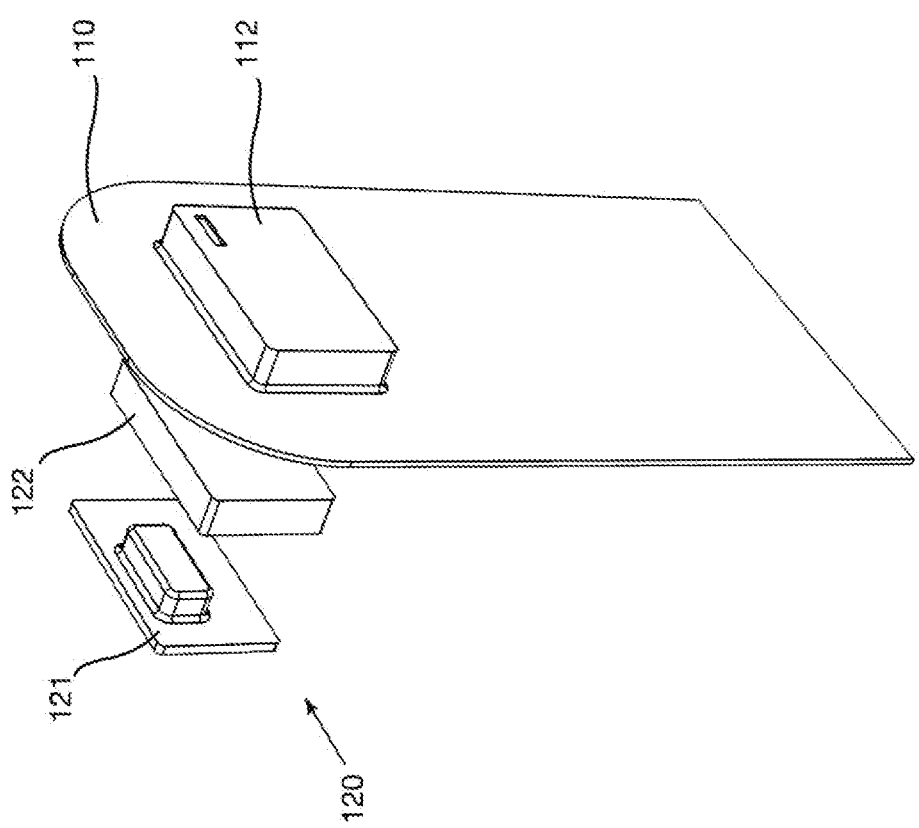
FIG. 3 Is a drawing illustrating a conventional integrated seatback information system in an exploded form from an interior view, to show the stack module of all system components of the information system pre-installation to a typical seat back shroud.

A schematic representation of a currently available display apparatus for use in a seat back 100, sometimes referred to as a vehicle information integrated system 120 is shown in FIG. 1 and FIG. 2. As described hereinbefore, it will be appreciated that the vehicle information integrated system 120 includes a large number of discrete system components that are stacked together and self-contained within a housing enclosure. Typically, as shown in FIG. 2 and FIG. 3, these currently available vehicle information integrated systems 120 consist of a removable front assembly 121, and a seat mounting bracket 122 for having the removable front assembly 121 installed therein. The seat mounting bracket 122 is itself to be installed in a molded recess 112, sometimes referred as a molded space envelope 112, defined in a seatback shroud 110. With reference to FIG. 4, the removable front assembly 121 comprises a front facia 123, a digital display 124, a main circuit board 125 and a mid enclosure 126. As will be appreciated, a thickness of the vehicle information integrated system 120 can be substantially more than a thickness of the digital display 124 along, due at least in part to the presence of the circuit board 125 stacked with the digital display 124.

There are also installation difficulties with the currently-available vehicle information integrated systems 120 described hereinbefore. For example, during retrofit in passenger seats, the installation of the vehicle information integrated systems 120 require a significant amount of power, generate heat at the passenger headrest, increase the overall thickness of the passenger headrest, increase the overall weight of the passenger seat significantly and alter the seats overall centre of gravity.

In this context, the present inventor has realised that a display apparatus that separates multiple system components into a flatter, more spaced-out, simpler and lighter assembly may be desirable. The display apparatus disclosed herein may also require less power. In combination, the disclosed display apparatus may prove desirable and provide a basis for a wide range of system applications, such as vehicle information systems for use aboard passenger vehicles such as aircraft, ships, spacecrafts, trains or other land-based motor-vehicles, including automobiles such as buses. At least some of the drawbacks identified hereinbefore can be overcome by the display apparatus disclosed with reference to FIGS. 5 to 14. In embodiments, the disclosed display apparatus is an ultra slim, lightweight, low powered, low profiled, highly flexible, multi-configurable, multi-orientation, easily removable/replaceable separated assembly vehicle information system 330, sometimes referred to herein as an electronic display apparatus 330.

The separated assembly system 330 can advantageously be provided with any appropriate orientation, dimensions, configuration, combination, to receive and display video signals, at any suitable location within a depth space restricted environment. In examples, the video signals may be referred to as image data, which is any data indicative of a visual content to be displayed on the separated assembly system 330, sometimes referred to as the electronic display apparatus 330. Examples of alternative embodiments aboard a passenger vehicle (shown in FIGS. 9-11) can be installing the separated assembly vehicle information system 330 inside passenger seats 400 mounted behind the seats back 401; inside baggage bin 500; or on monument wall assemblies 600 (lavatories, galleys, bulkhead partitions, closets) using a decorative panel shroud 601.

Figure 7:
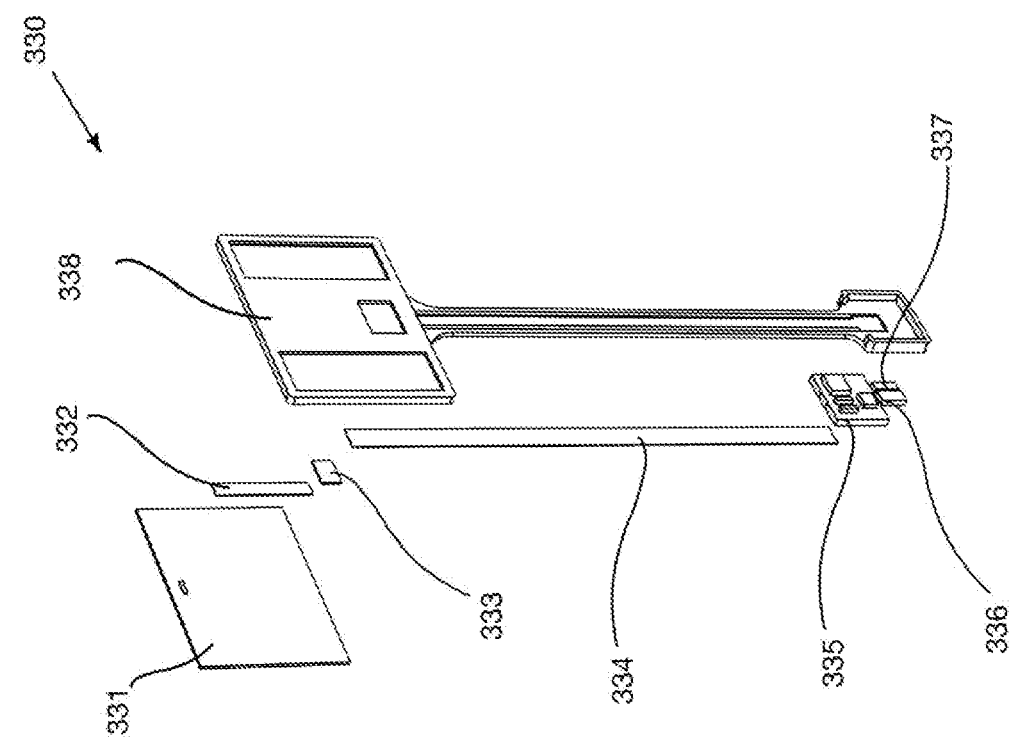
FIG. 7 is a drawing illustrating the present described invention of a seatback information system in an exploded form from a reverse view to show the vertically separated modules of all the system components of the information system pre-assembly.

As shown in FIG. 7, the separated assembly system 330, is assembled inside support frame 338, sometimes referred to as a protective substrate 338. The support frame 338 typically provides a protective frame around each discrete electrical assembly component to protect against potential impacts, in some way analagous to a mobile phone bumper case. The support frame 338 also enables the assembled components to maintain a spaced relationship, for any specific length of extended low profile thin cable 334, as required. The separated assembly system 330 can also be configured to include a power connection 337 (for example Universal Serial Bus, USB power connection) and an audio video connection 336 (for example HDMI/DVI connection). The power connection 337 can be configured to receive low power (for example 5V DV, sometimes referred to as 5V DC) through a power distribution box (not shown) from the aircraft power distribution system 360, shown in FIGS. 12,13 and 14.

Figure 12:
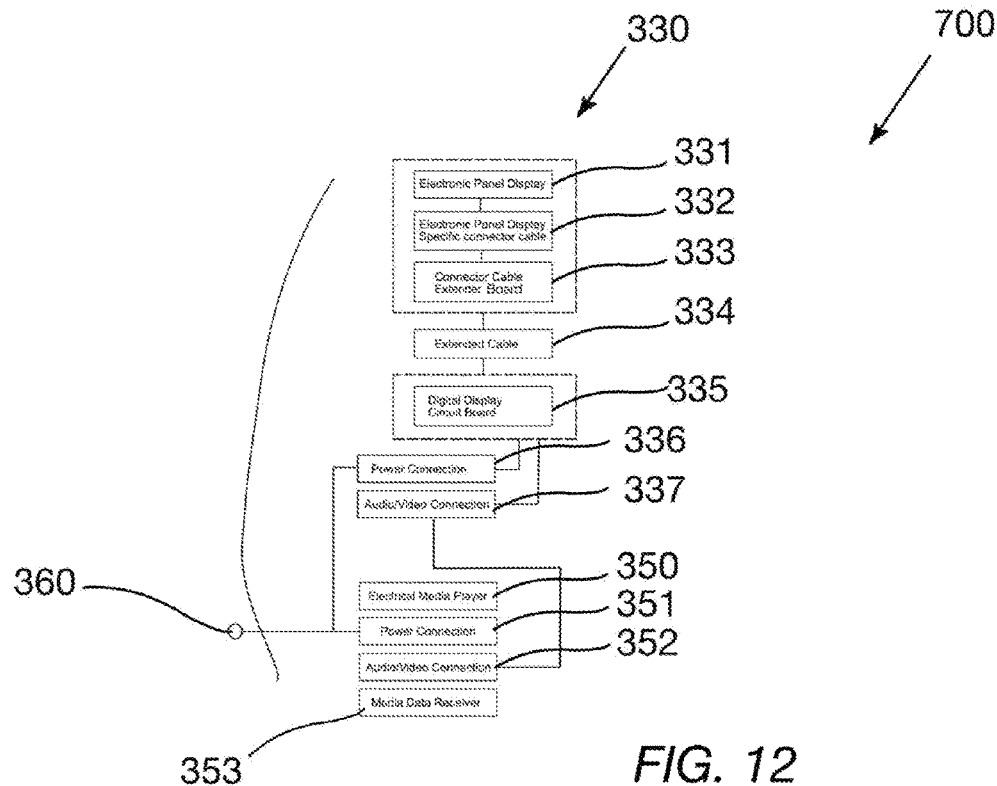
FIG. 12 is an exemplary system diagram illustrating an embodiment of a single assembly for the information systems of FIG. 8 connected to aircraft power and an external media playing source.
Figure 13:
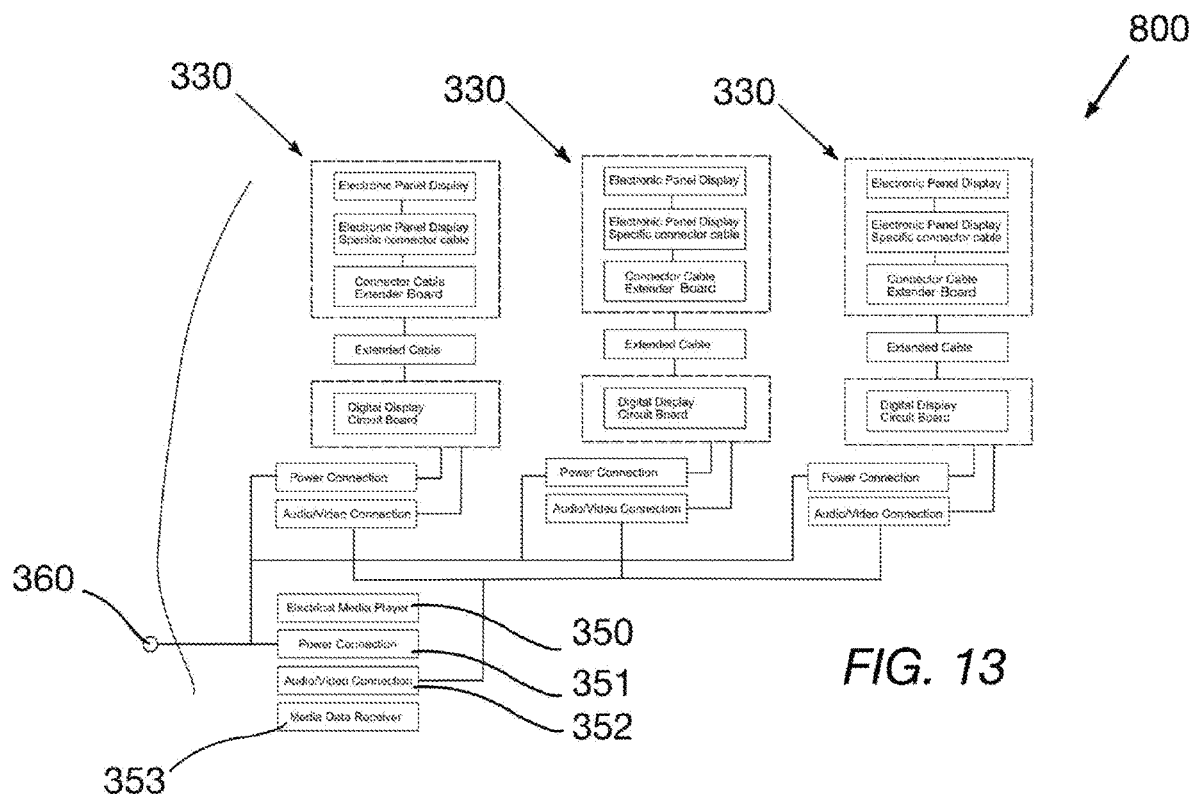
FIG. 13 is an exemplary system diagram illustrating one embodiment of a triple assembly for the information systems of FIG. 8 connected to aircraft power and a single typical media playing source.

As shown in FIG. 12 the separated assembly system 330, installed as a single unit can be configured to receive a video signal, for example from an external electrical media player 350. The external electrical media player 350, comprises of a power connection 351 that is configured to receive low power (for example 5V DV) through power distribution box (not shown) from the aircraft power distribution system 360. As shown in FIG. 13 the separated assembly system 330, can be installed as multiple chained units (in this example three separated assembly system 330), each of which can be configured to receive the same video signal, for example from an external electrical media player 350. The external electrical media player 350, comprises of a power connection 351 that is configured to receive low power (for example 5V DV) through power distribution box (not shown) from the aircraft power distribution system 360 The aircraft power distribution system 360, used to supply power to typical installation 700 & 800 as shown in FIGS. 12 and 13 is controlled from a master switch, for example in the passenger vehicle cockpit. The external electrical media player 350, further comprises of an audio and video connection 352 for example HDMI. The audio and video connection 352, can for example be advantageously configured to have multiple audio and video outputs, To provide the required audio and video signals for a number of separated assembly systems 330, such as a configuration group of three separate assembly systems 330 as shown in FIG. 12. The media data receiver 353, is configured to receive audio and video signals for example: through a wired connection, or wirelessly (such as transmitted from a nearby wireless access point, or transmitted from a passenger personal electronic device, such as casting video or screen mirroring). In addition the media data receiver 353, is configured to be able to transmit the audio wirelessly, such as via Bluetooth or similar to a compatible set of passenger blue tooth enabled headphones.

The separated assembly system 330, can also be configured where a digital display circuit board 335 for example a device for receiving 3 Transition Minimized Differential Signaling (TMDS) pairs and a clock signal and converting this into image signals, for example outputting 4 Low Voltage Differential Signaling LVDS or OLDI (OpenLDI) data pairs (1 channel); or 8 LVDS/OLDI data pairs and clocks (2 channel) to drive the electronic display to display the content, is replaceable with a digital display circuit board with integrated media content playing and media data wireless receiving functionality 335A. This is advantageous where a preferred embodiment would not require an external electrical media player 350, but rather media playing functionality built in directly into the separated assembly system 330, but not in direct proximity to the dedicated display area as an integrated unit.

The separated assembly system 330, includes a digital display circuit board 335 that is configured to transfer the supplied power from the power connection 336 and suitably convert and configure the audio and video signals from the audio and video connection 352 to the required format to broadcast the video signal correctly at the electronic panel display 331, such as via the circuit board's digital display port connector. In the currently available vehicle information integrated systems 120 the digital display circuit board is produced as an electrical component assembly that is integrated with a main circuit board 125 which is then mounted directly behind an electronic panel display 124 as shown in FIG. 4. Advantageously with the separated assembly system 330 disclosed herein, the independent digital display circuit board 335 can be located at a distance away from the electronic panel display 331, by means of an extended low profile thin cable 334, such as an electronic panel display ribbon cable, to create a much lower profile installation.

The separated assembly system 330, provides further advantages by means of improved maintenance access, with the feature of being able to locate the digital display circuit board 335 at an maintenance accessible area, for example an access panel or similar.

The separated assembly system 330, provides further advantages by means of improved maintenance access, with the feature of being able to locate the external electrical media player 350 at an maintenance accessible area, for example an access panel or similar.

The separated assembly system 330, includes a connector cable extender component board 333, such as but not limited to, an active powered embedded DisplayPort (eDP) converter, or a passive powered embedded DisplayPort (eDP) converter, that is configured to connect the electronic panel display specific connector cable 332 and the extended low profile thin cable 334. This is advantageous in that it allows the extended low-profile thin cable 334, such as, but not limited to, ribbon cables, or flexible flat cable (FFC), or any other cable that possesses flat solid conductors, to be configured in a number of design configurations that allow the digital display circuit board 335 to be installed at a maintenance accessible area.

The separated assembly system 330, includes electronic panel display 331, that is configured as an independent, low power, display panel. Such electronic panel display 331, can include but not limited to adhesive protection shields in combination with touchscreen panels, liquid-crystal displays (LCD), organic light emitting diode's (OLED), active matrix organic light emitting diode (AMOLED), electronic paper (ePaper/elnk/EPD), flexible displays using but not limited to thin film transistor technology (TFT), organic liquid-crystal display (OLCD). The electronic panel display 331, can be configured to any viewable area required at the area of installation, such as wide narrow banner displays to much larger viewable area displays.

Figure 6:
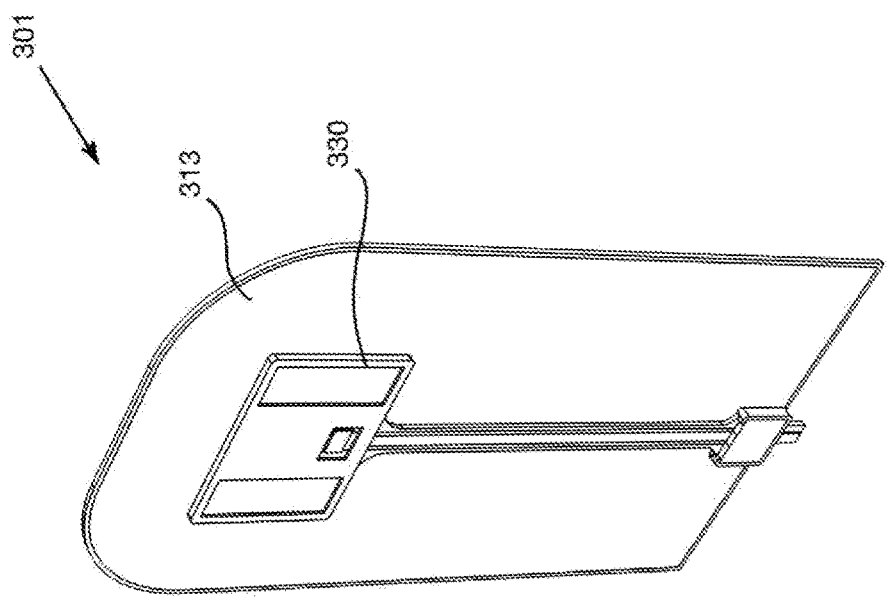
FIG. 6 is a drawing illustrating the present described invention of an integrated seatback information system from an interior view, where in all of the vertically separated system components of the information system are installed inside a protective substrate, mechanically attached to a typical seat back shroud.
Figure 10:
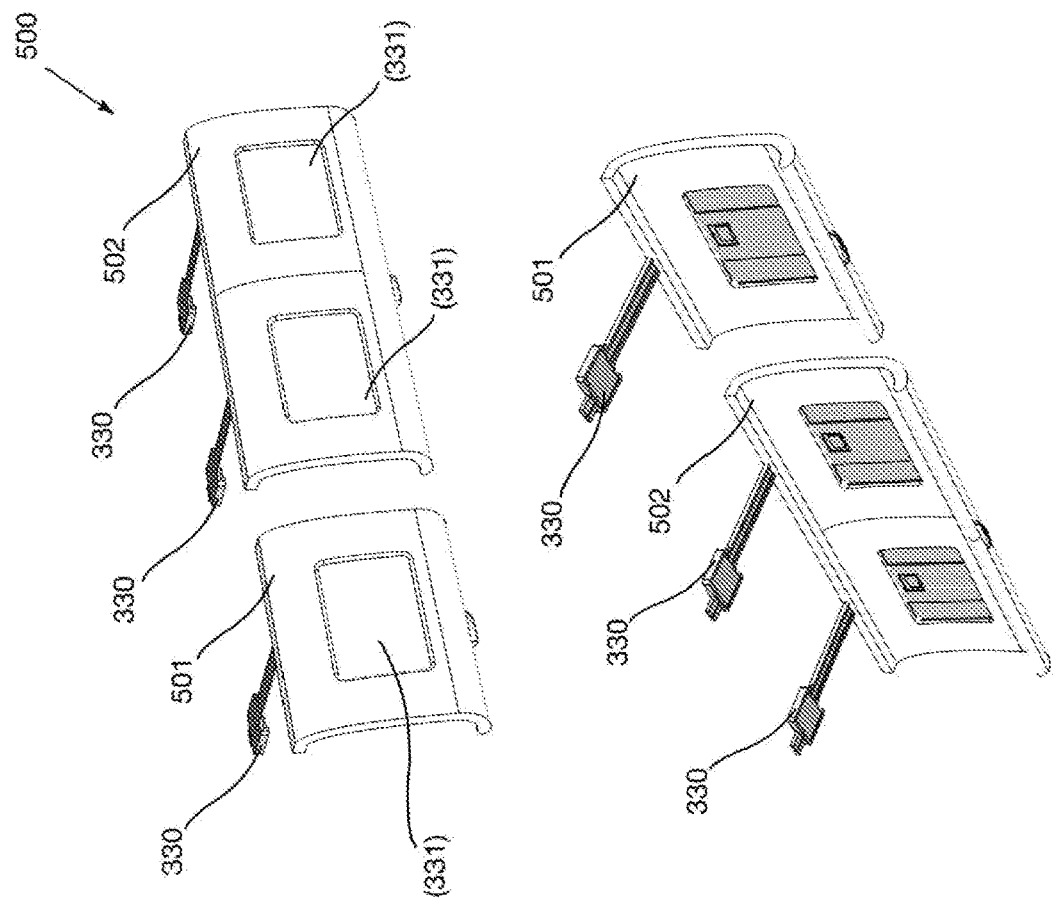
FIG. 10 is an exemplary detail drawing illustrating an alternative embodiment of the integrated system module of FIG. 8, wherein the integrated vertically separated system modules are disposed within a protective substrate and configured for installation in a typical overhead stowage compartment door assemblies of selected single or double overhead storage compartments.
Figure 9:
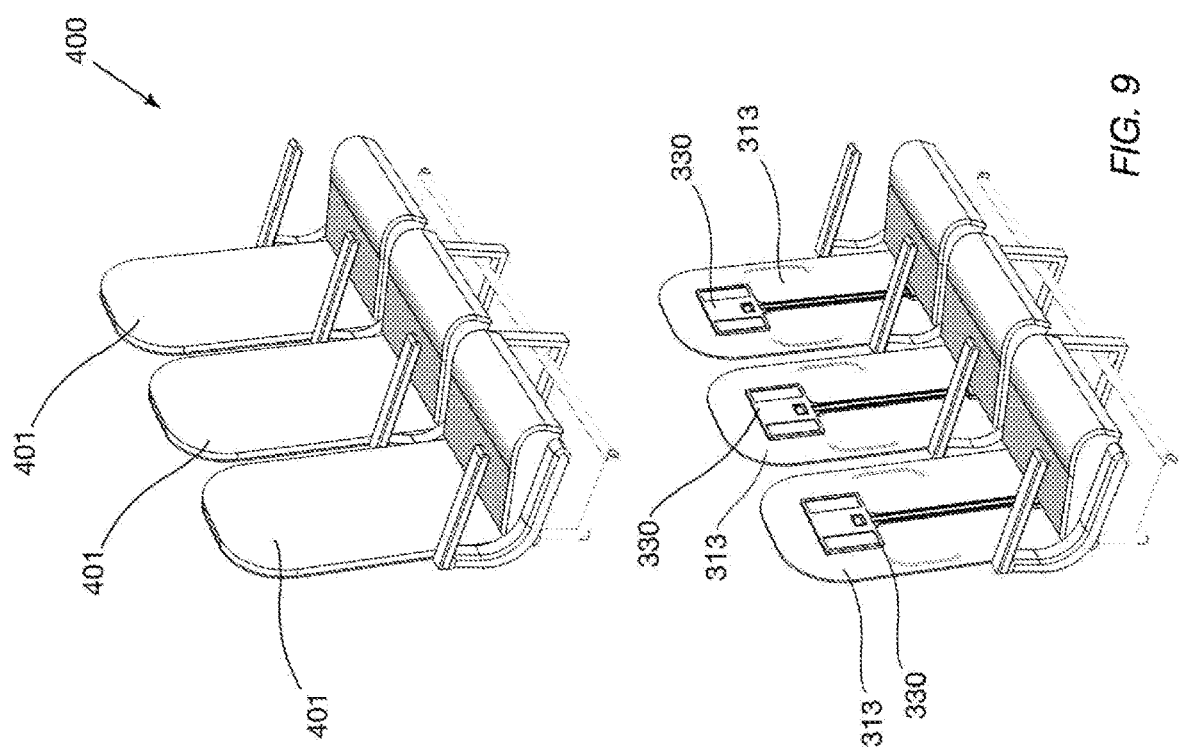
FIG. 9 is an exemplary detail drawing illustrating an embodiment of the integrated system module of FIG. 8, wherein the integrated vertically separated system modules are disposed within a protective substrate and configured for installation on a typical seatback shroud of selected user seats.

The separated assembly system 330, can be mechanically installed (not limited to removable fasteners, adhesive bonding, moulded slots, retaining clips) to a typical substrate (such as but not limited to metallic/composite/plastic) on a passenger seat back shroud 313 as shown in FIGS. 6 & 9, on an overhead storage compartment decorative panel 501 & 502 as shown in FIG. 10, on a monument wall decorative panel 601 as shown in FIG. 11. The separated assembly system 330, is advantageously installed to maintenance removable covers, closing panels or shrouds that allow the overall monument to remain in situ and therefore accessible to be serviced and/or replaced by another separated assembly system 330, with relative ease. The separated assembly system 330 is also advantageous in vehicle line maintenance as it can be easily installed in the last row of seats as unused spares should any of the active displays require repair via swapping.

The separated assembly system 330, has an advantageous thin profile that allows for a seamless clean aesthetic at the area of installation, allowing for more improved industrial design applications, overcoming the associated protrusion into the passenger spaces with the currently available vehicle information integrated system 120, for example mounting the vehicle information integrated system 120 to a monument wall.

Reducing the number of external electrical media players 350 required for a configuration of three separate assembly systems 330 shown in FIG. 12, significantly reduces the overall weight of the passenger information system installed at that location, where with currently available vehicle information integrated systems 120, consists of an electrical media player integrated with the main circuit board 125, dedicated to each digital display 124. This reduction in the number of external electrical media players 350 is also advantageous in improving fuel saving, increasing payload and improving seat pitch and comfort.

The separated assembly system 330 has an advantageous component arrangement; as no electrical circuit board is located in the headrest area, there is a reduction in the thermal energy generated in contrast to a currently available vehicle information integrated system 120.

The separated assembly system 330, has an advantageous feature being extremely light in assembly weight allowing for installation onto light weight substrates that would not be able to support a currently available vehicle information integrated system system 120 and continue to meet the stringent safety requirements.

Figure 5:
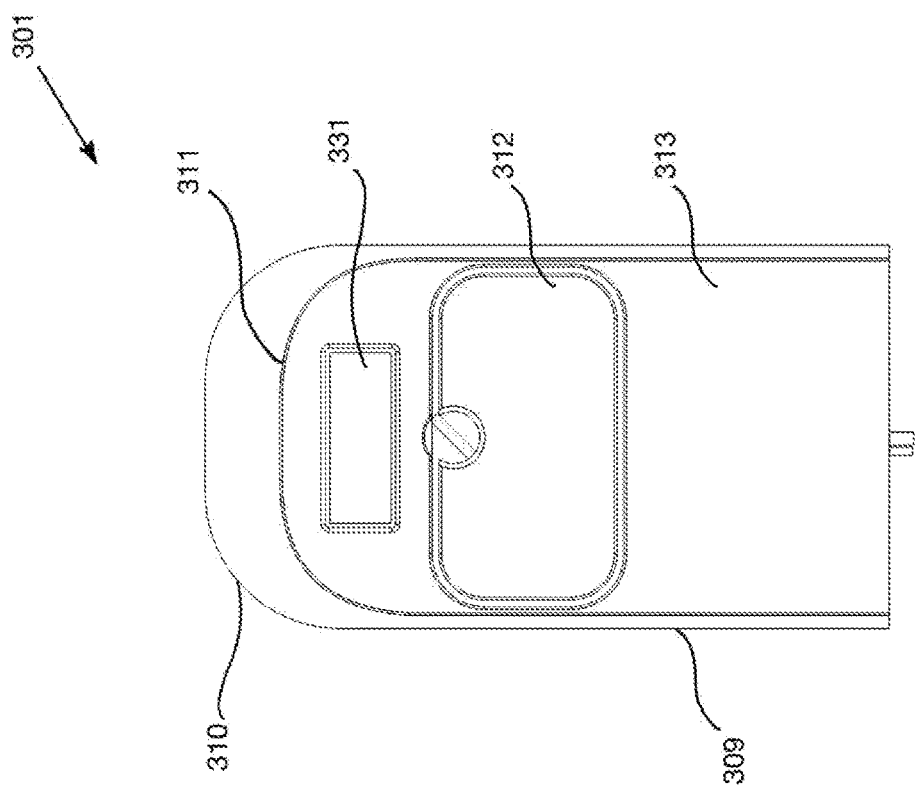
FIG. 5 is a drawing illustrating the present described invention of an integrated seatback information system, where in all of the system components of the information system are installed inside an enclosed unit in a typical seat back shroud.
Figure 8:
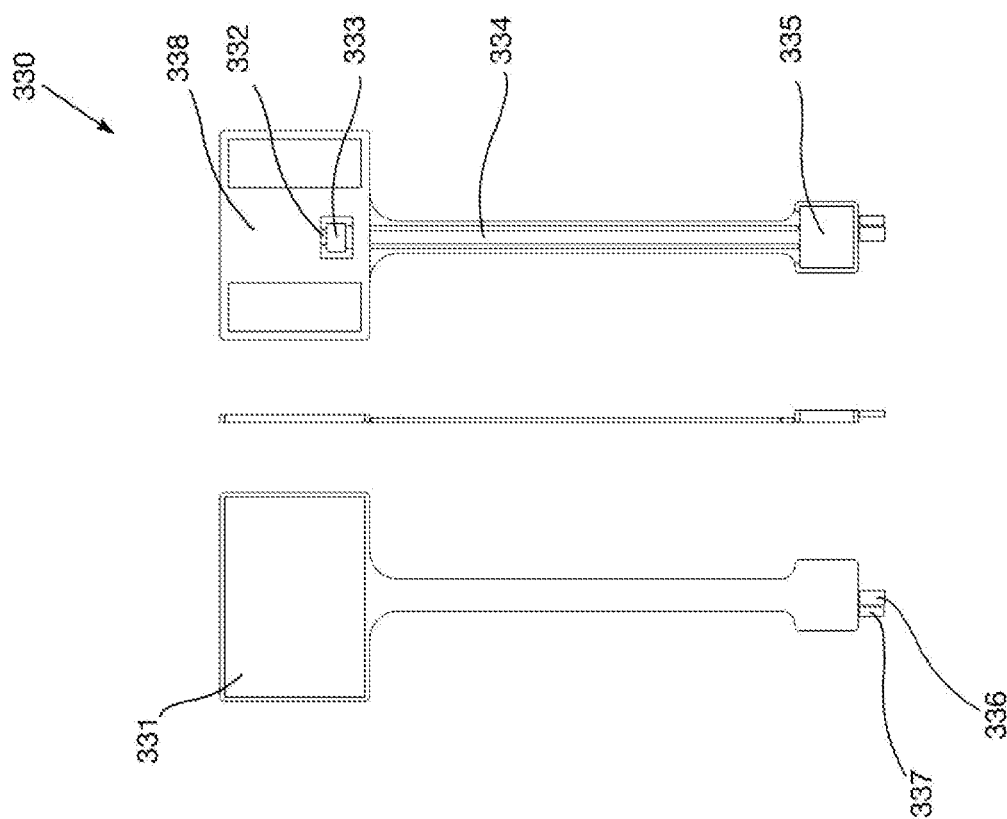
FIG. 8 is an illustration of the current described invention, in its entirety fully assembled unit state. With the vertically separated system components assembled inside the protective substrate.

FIG. 5 illustrates an example installation 301 of the separated assembly system 330 into a passenger seat back 309. as seen from the passenger view. The electronic panel display 331 is visible in a vacant area behind the headrest area 310, in the middle area between the top of the tray table 312 and below the edge of the headrest seat back cover 311 and mounted directly behind the removable passenger seat back shroud 313.

FIG. 6 illustrates an example installation 301 of the separated assembly system 330, into a passenger seat back shroud 313. FIG. 7 illustrates an exploded view of the separated assembly system 330, which comprises of an extended low profile thin cable 334, a support frame 338; the digital display circuit board 335, the electronic panel display specific connector cable 332, the electronic panel display 331 and the connector cable extender component board 333.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. An electronic display apparatus comprising:
    a support frame, the support frame providing a protective frame around:
    an electronic display configured to display content based on image data; and
    a display driver circuit to receive the image data and to supply an image signal to the electronic display to cause the electronic display to display the content, the image signal based on the image data; and
    a connector cable connecting the display driver circuit and the electronic display for transmission of the image signal from the display driver circuit to the electronic display;
    wherein the support frame is mountable to one or more surfaces so as to mount the electronic display to a first portion of the one or more surfaces and mount the display driver circuit to a second portion of the one or more surfaces that is away from the first portion, and the support frame maintains the electronic display in a spaced relationship from the display driver circuit.

2. The electronic display apparatus of claim 1, wherein at least a portion of the support frame is flexible.

3. The electronic display apparatus of claim 1, wherein the connector cable is flexible.

4. The electronic display apparatus of claim 1, wherein the connector cable comprises a first cable portion connected to the electronic display, a second cable portion connected to the display driver circuit and a cable connector electrically connected between the first cable portion and the second cable portion, and wherein the cable connector is removably connected to at least one of the first cable portion and the second cable portion.

5. The electronic display apparatus of claim 1, wherein a length of the connector cable is greater than 30 centimetres.

6. The electronic display apparatus of claim 1, wherein the display driver circuit is removably connected to the electronic display.

7. The electronic display apparatus of claim 1, wherein a thickness of the electronic display apparatus in the region of the electronic display is less than 10 millimetres.

8. The electronic display apparatus of claim 1, wherein the display driver circuit is configured to receive image data from a further electronic device, the image data indicative of the content to be displayed on the electronic display.

9. The electronic display apparatus of claim 1, wherein the one or more surfaces are one or more surfaces in a vehicle.

10. The electronic display apparatus of claim 9, wherein the vehicle is an aircraft.

11. The electronic display apparatus of claim 10, wherein the one or more surfaces includes a seat back.

12. The electronic display apparatus of claim 9, wherein the one or more surfaces includes an internal wall of a passenger cabin.

13. The electronic display apparatus of claim 12, wherein the one or more surfaces includes an overhead storage compartment.

14. A seat back for a vehicle, the seat back having a headrest portion, having defined on a rear surface thereof, a recess for receiving the electronic display apparatus of claim 1, the recess having:
    a first portion to receive the electronic display at a headrest portion of the seat back;
    a second portion configured to be located below the headrest portion, to receive the display driver circuit; and
    a third portion connecting the first portion and the second portion to receive the connector cable therein.

15. The seat back of claim 14, further comprising the electronic display apparatus of claim 1, mounted in the recess.

16. A plurality of seats, each seat in the plurality of seats comprising the seat back of claim 15, further comprising an electrical media player in data communication with the display driver circuits for each of the seat backs.

17. An overhead storage compartment for a vehicle, the overhead storage compartment comprising a compartment door, wherein the electronic display apparatus of claim 13 is mounted such that the electronic display of the electronic display apparatus is mounted to the compartment door.

18. The overhead storage compartment of claim 17, wherein the display driver circuit is mounted off the compartment door.

\* \* \* \* \*